(12) United States Patent
Yamagishi

(10) Patent No.: US 6,416,934 B1
(45) Date of Patent: Jul. 9, 2002

(54) MANUFACTURING METHOD OF A SURFACE ACOUSTIC WAVE DEVICE

(75) Inventor: Masao Yamagishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 31 days.

(21) Appl. No.: 09/605,658

(22) Filed: Jun. 28, 2000

(30) Foreign Application Priority Data

Dec. 9, 1999 (JP) ............................................ 11-350158

(51) Int. Cl.[7] ............................ G03F 7/00; B05D 5/12; H04R 17/00
(52) U.S. Cl. ...................... 430/314; 430/311; 430/312; 430/313; 430/316; 430/317; 430/318; 430/319; 427/100; 29/25.35
(58) Field of Search ................................. 430/311, 312, 430/313, 314, 316, 317, 318, 319; 29/25.35; 427/100

(56) References Cited

U.S. PATENT DOCUMENTS

| 3,963,568 A | * | 6/1976 | Nikaido et al. | 204/181 |
| 4,472,652 A | * | 9/1984 | Brice et al. | 310/313 |
| 5,390,401 A | * | 2/1995 | Shikata et al. | 29/25.35 |

* cited by examiner

Primary Examiner—Mark F. Huff
Assistant Examiner—Nicole Barreca
(74) Attorney, Agent, or Firm—Volentine Francos, PLLC

(57) ABSTRACT

An interdigital electrode of a SAW device is protected by a protective layer during a photo-lithography etching process which is used to apply a bonding pad. As the bonding pad can be formed by the photo-lithography etching process, it is possible to obtain regularly shaped bonding pads without damaging the characteristics of the SAW device.

10 Claims, 5 Drawing Sheets

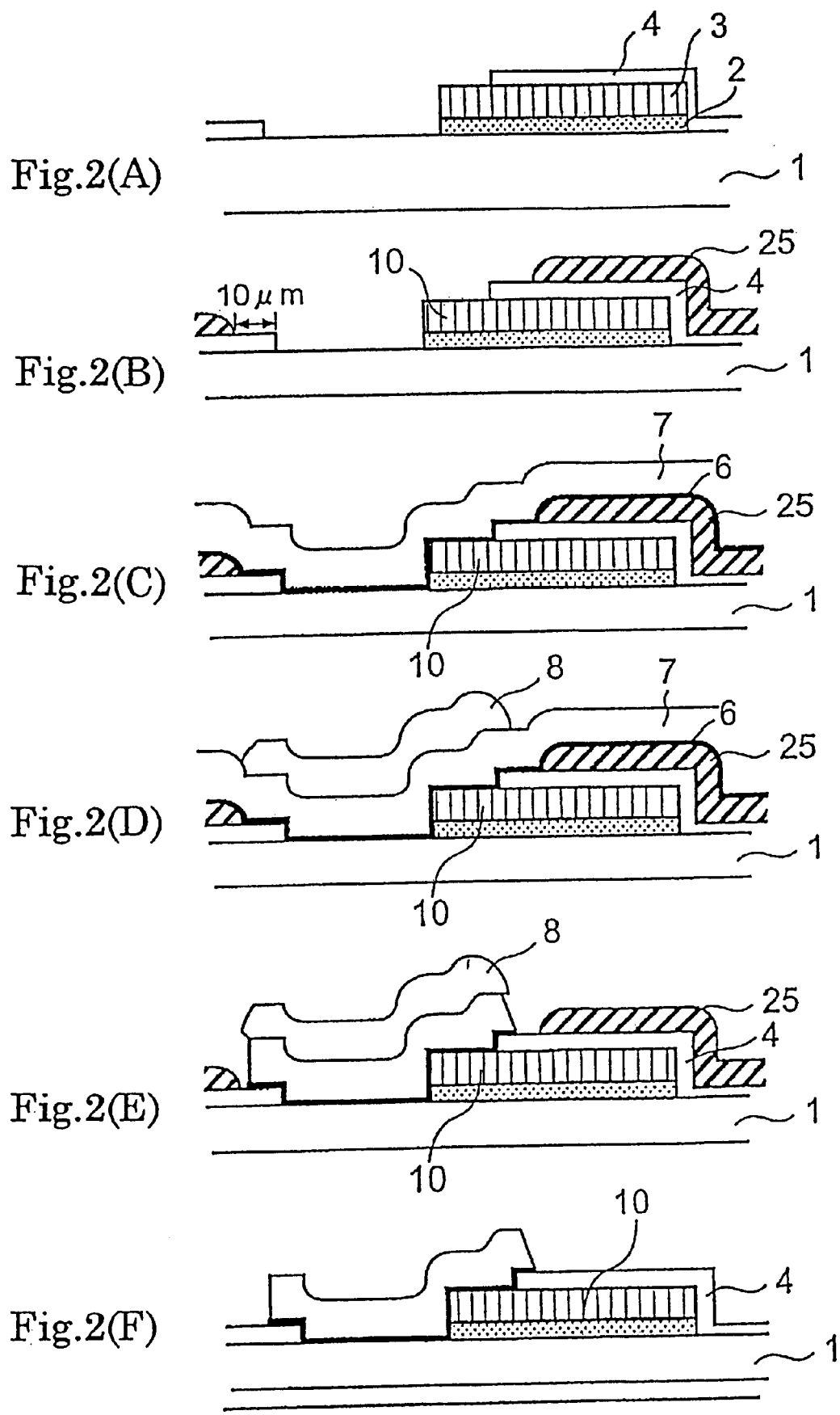

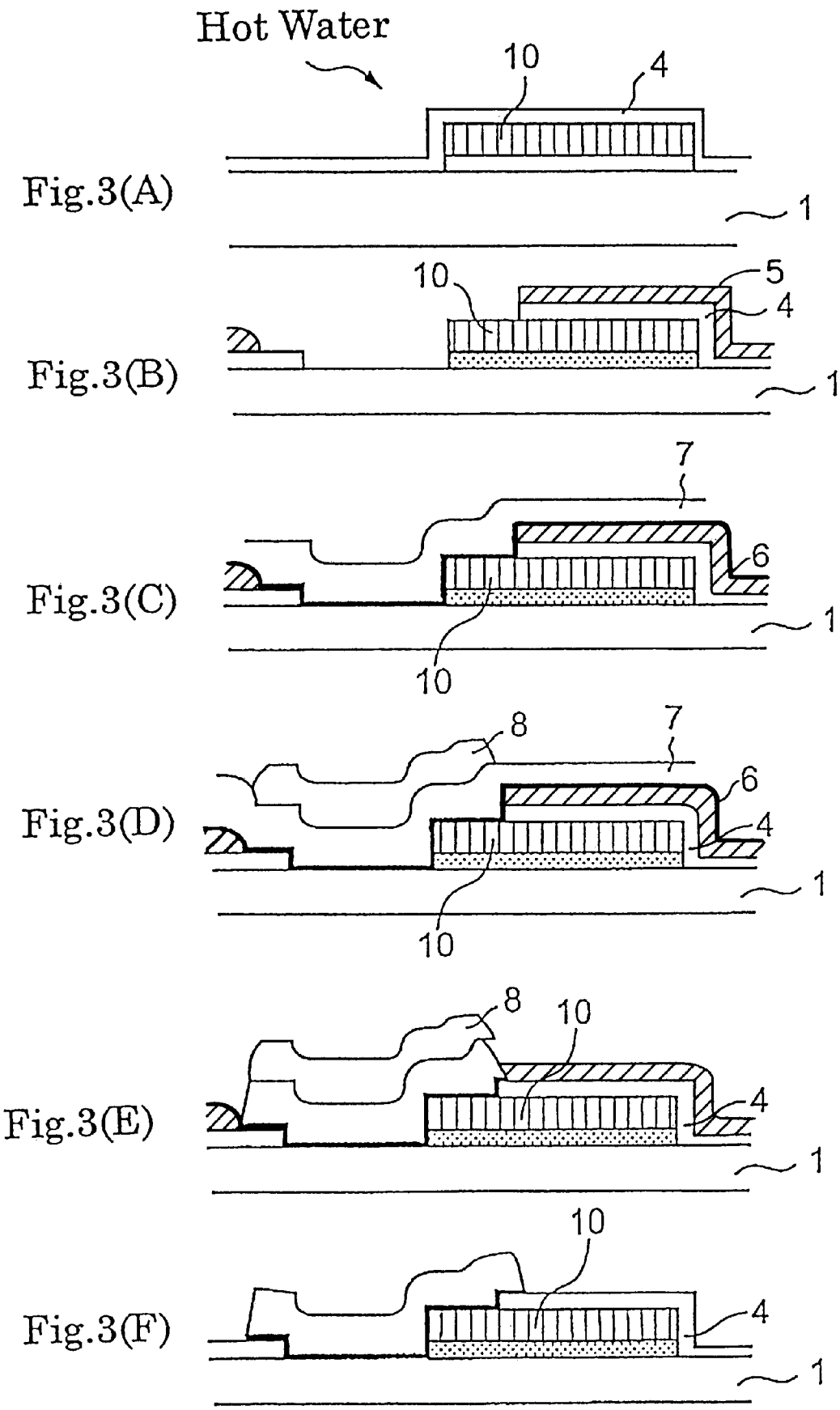

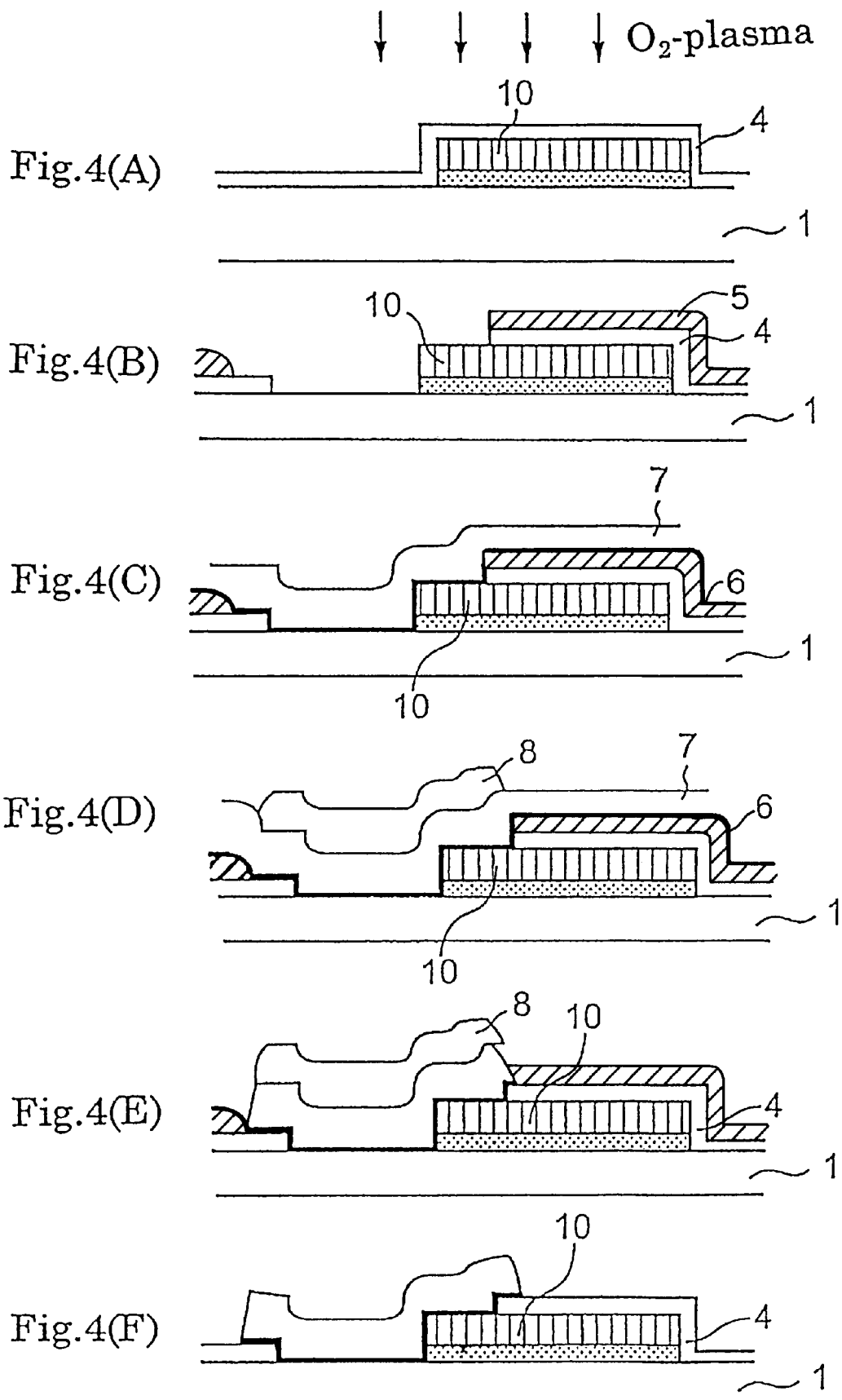

MANUFACTURING METHOD OF A SURFACE ACOUSTIC WAVE DEVICE

FIELD OF THE INVENTION

The present invention relates to a method of manufacturing a surface acoustic wave (SAW) device, such as a SAW filter.

BACKGROUND OF THE INVENTION

A conventional method of manufacturing a surface acoustic wave device (SAW device) is shown in FIG. 5.

A metal layer which comprises Al—Cu (aluminum-copper alloys) is formed on a piezoelectric substrate 51 made of $LiTaO_3$. Then, the metal layer is patterned using a conventional photo-lithography etching method to form an interdigital electrode 52, as shown in FIG. 5(A).

An oxide layer 53 is formed on the substrate 51. Then, a part of the oxide layer 53, which corresponds to a pad region where a bonding pad will be formed later, is opened using the conventional photo-lithography etching method, as shown in FIG. 5(B).

Then, a resist layer 54 is formed on and above the substrate 51. The resist layer 54 is opened in the pad region such that a side surface thereof is inversely tapered, as shown in FIG. 5(C).

A pad electrode layer 55 is formed on and above the substrate 51, as shown in FIG. 5(D). The pad electrode layer 55 is comprised of two layers, with the lower layer thereof being Cr (chromium) or Ti (titanium) and the upper layer thereof being Au (gold).

Then, the resist layer 54 is removed by acetone and a bonding pad 56 is formed using a conventional lift off method, as shown in FIG. 5(E).

However, using the lift off method, it is initially difficult to obtain regularly shaped bonding pads. Further, a material of the pad electrode layer which does not dissolve in the acetone can sometime attach to the substrate.

To avoid such problems, one might consider forming the bonding pad using a conventional photo-lithography etching process. However, the oxide layer on the interdegital electrode is extremely thin, which is a characteristic of the SAW device. Therefore, if the bonding pad were etched using the conventional photo-lithography etching process, the interdigital electrode under the oxide layer would likely be etched as well. This would adversely change the characteristics of the SAW device.

SUMMARY OF THE INVENTION

An object of the present invention is to provide a method of manufacturing a surface acoustic wave (SAW) device in which a bonding pad may be formed using a photo-lithography etching process without changing the characteristics of the SAW device.

To achieve the above and other objects, an interdigital electrode of a SAW device according to the invention is protected by a protective layer during a photo-lithography etching process which is applied to a bonding pad.

According to the present invention, as the bonding pad can be formed using a photo-lithography etching process, it is possible to obtain regularly shaped bonding pads without damaging the characteristics of the SAW device

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2(A)–FIG. 2(F) are cross-sectional views describing a method of manufacturing an SAW device according to a second preferred embodiment.

FIG. 3(A)–FIG. 3(F) are cross-sectional views describing a method of manufacturing an SAW device according to a third preferred embodiment.

FIG. 4(A)–FIG. 4(F) are cross-sectional views describing a method of manufacturing an SAW device according to a fourth preferred embodiment.

DESCRIPTION OF THE PREFERRED EMBODIMENTS

The present invention will be described hereinafter with reference to the accompanying drawings. The drawings used for this description typically illustrate major characteristic parts in order that the present invention will be easily understood.

A method of manufacturing a surface acoustic wave (SAW) device will be shown hereinafter referring to FIG. 1(A)–FIG. 1(F). The explanation below will focus on the manufacture of a main portion thereof according to the present invention.

Figure 1A:
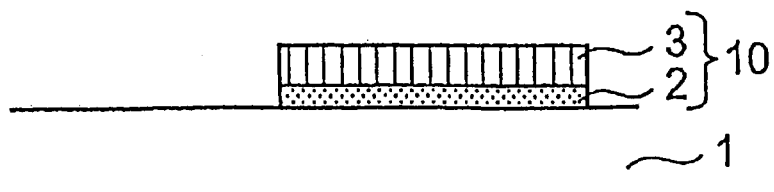
FIG. 1(A)–FIG. 1(F) are cross-sectional views describing a method of manufacturing an SAW device according to a first preferred embodiment.

A Cr (chromium) layer 2 which has a thickness of 100 Å and a Al—Cu (aluminum-copper alloys) layer 3 which has a thickness of 1700 Å are formed on a piezoelectric substrate 1 made of $LiTaO_3$. The Cr layer 2 and the Al—Cu layer 3 are continuously formed in the same sputtering system. Then, the Cr and Al—Cu layers 2, 3 are patterned using a conventional photo-lithography etching method to form an interdigital electrode 10, as shown in FIG. 1(A). This interdigital electrode 10 is an arch-shaped electrode, such as the electrodes shown in U.S. Pat. No. 5,559,481.

Then, an insulating layer, in this embodiment an oxide layer 4 which has a thickness of 500 Å, is formed on the substrate 1 using a sputtering method.

Figure 1B:
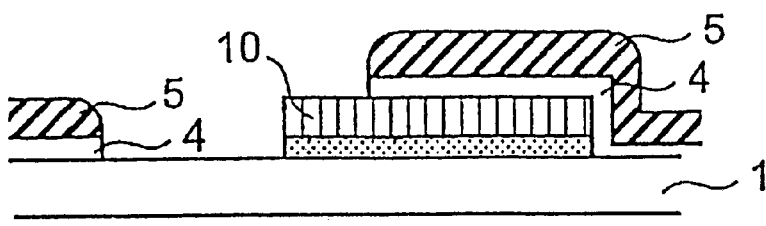

A first resist layer 5 which has a predetermined pattern is formed on the oxide layer 4. A portion of the oxide layer 4 is opened by dry etching with mixed gases of $CF_4$ and $O_2$ using the resist layer 5 as a mask, as shown in FIG. 1(B). The opened portion is in a bonding pad region where a bonding pad will be formed thereon. In this embodiment, the bonding region is adjacent to an interdigital electrode region where the interdigital electrode 10 is formed thereon. A portion of the oxide layer 4 on the interdigital electrode 10 which is adjacent to the opened portion is removed at that time.

Figure 1C:
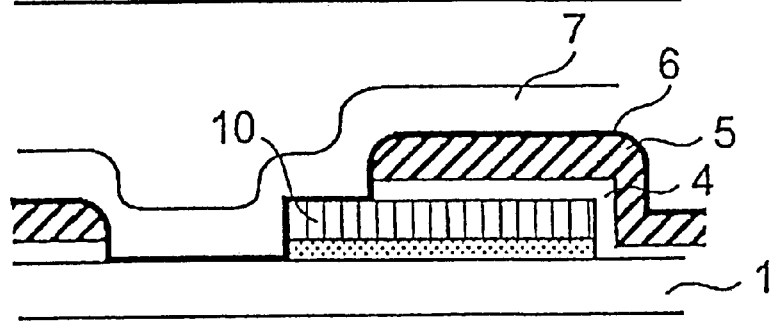

A Cr (chromium) layer 6 which has a thickness of 500 Å is formed on the first resist layer 5 and an exposed surface of the substrate 1. The Cr layer 6 extends from the opened portion to a surface of the first resist layer 5, as shown in FIG. 1(C). Then, an Au (gold) layer 7 which has a thickness of 5000 Å is formed on the Cr layer 6. These two layers of the Cr layer 6 and the Au layer 7 are continuously formed in the same sputtering system and will become a bonding pad electrode. The Cr layer 6 prevents the Au layer 7 from reacting with an aluminum of the Al—Cu layer 3. If the Au layer 7 contacts the Al—Cu layer 3 directly, an undesirable alloy may be formed. Further, the Cr layer 6 functions to enhance an adherence between the Au layer 7 and the Al—Cu layer 3.

Figure 1D:
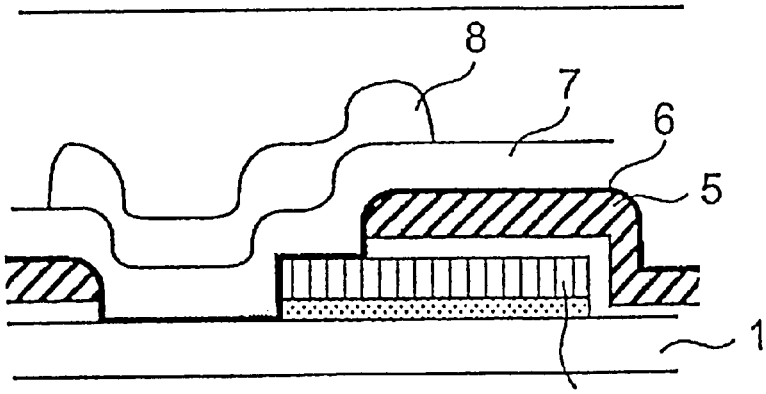

A second resist layer 8 is formed on the Au layer 7 in the bonding pad region, as shown in FIG. 1(D).

Figure 1E:
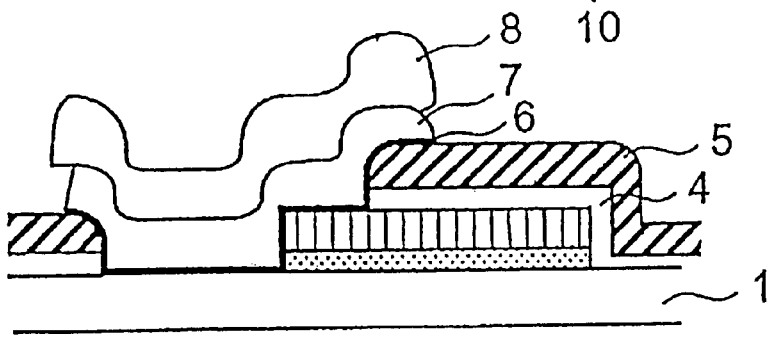

The Au layer 7 is etched by a etching liquid which comprises KI:KCl:I:$H_2O$=10:5:1:44 using the second resist layer 8 as a mask. Then, the Cr layer 6 is etched by a etching liquid which comprises of a Ce (cerium) ammonium nitrate: 14%, a perchloric acid:5%, $H_2O$:80% and an interfacial active agent, using the second resist layer 8 as a mask, as shown in FIG. 1(E).

Figure 1F:
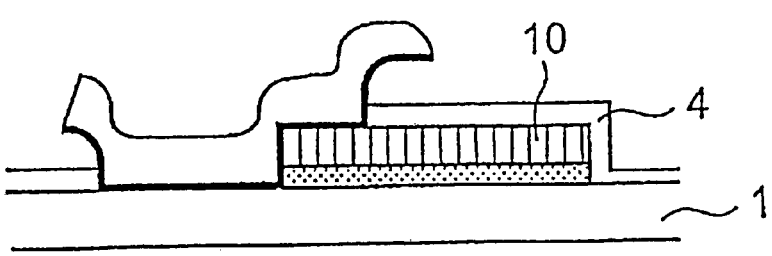
Figure 5A:
FIG. 5(A)–FIG. 5(E) are cross-sectional views describing a conventional method of manufacturing an SAW device.
Figure 5B:
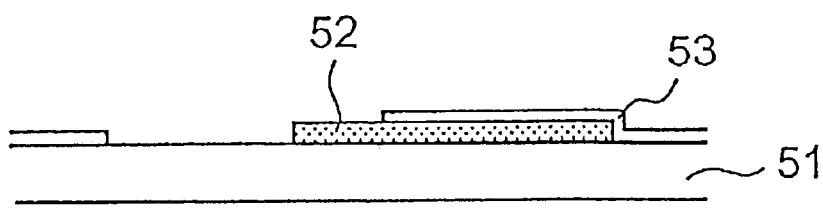
Figure 5C:
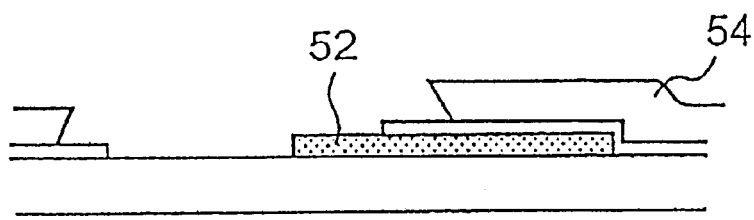
Figure 5D:
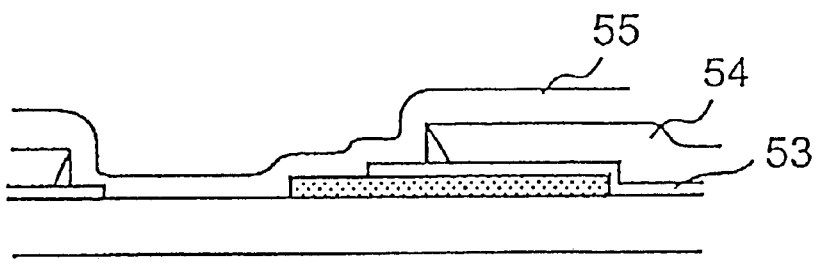
Figure 5E:
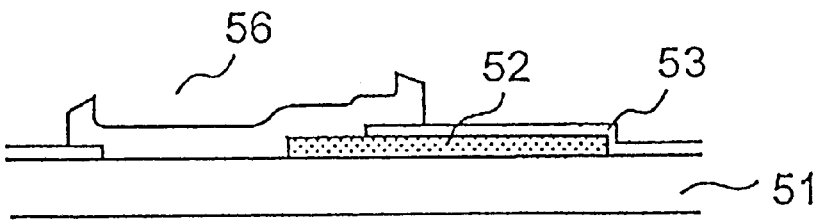

The second resist layer 8 and the first resist layer 5 are removed and a bonding pad is completed, as shown in FIG. 1(F).

Then, a predetermined process, such as a wire bonding and a resin encapsulating is carried out. Finally, the SAW device, such as a SAW filter is completed.

As the SAW device of the present invention includes the bonding pad, the interdigital electrode is not directly damaged during a bonding process. If wires were bonded to the interdigital electrode directly during the bonding process, the interdigital electrode would be transformed by the impact of the bonding. As a characteristic of the SAW device depends on the interdigital electrode, it is important that damage of the interdigital electrode be avoided.

As the bonding process is carried out at a comparatively low temperature to avoid heat transformation, an Au layer is used for the top layer of the bonding pad. As wires of Au are used at the bonding process generally, the top layer of Au is suitable for adherence between the wires and the top layer.

As the interdigital electrode is connected to the Au wires through the bonding pad, an undesirable alloy is not formed between the Au wires and the Al—Cu layer.

According to the first preferred embodiment, when the Cr layer 6 and the Au layer 7 for the bonding pad are etched in a photo-lithography etching process using the second resist layer 8 as a mask, the first resist layer 5 protects the interdigital electrode 10 from the etching. Thus, there is no damage of the interdigital electrode 10.

Further, as it is easy to remove the first resist layer 5 by an ashing process, a thin oxide layer 4 can be formed. So, influences resulting from a thickness of the oxide layer 4 can be minimized. That is, characteristic changes of the SAW device can be avoided.

In this embodiment, the Cr layer 6 is removed by a wet etching process. However, a dry etching process can be applied to remove the Cr layer 6. A apparatus of the wet etching process is more simple than that of the dry etching process, and a treatment time of the wet etching process is shorter.

According to the first embodiment of the present invention, it is possible to form a bonding pad by a photo-lithography etching process without changing a characteristic of the SAW device. Thus, it is possible to precisely form a bonding pad and to provide a better SAW device.

A manufacturing method according to the second embodiment will be described hereinafter referring to FIG. 2(A)–FIG. 2(F). Elements of this embodiment which are similar to the first embodiment are marked with the same reference symbols as the first embodiment. Before the step of FIG. 2(A), steps which corresponds to the steps of FIG. 1(A)–FIG. 1(B) are carried out. Then, the first resist layer 5 which is used a mask for the oxide layer 4 is removed after patterning the oxide layer 4, as shown in FIG. 2(A).

Then, a protective resist layer 25 which has a predetermined pattern is formed on the oxide layer 4 so as to expose about 10 μm of the oxide layer 4 in the vicinity of the opened portion, as shown in FIG. 2(B). That is, the opened portion is 20 μm wider than that of the first embodiment.

Similarly, a Cr (chromium) layer 6 which has a thickness of 500 Å is formed on the protective resist layer 25 and an Au (gold) layer 7 which has a thickness of 5000 Å is formed on the Cr layer 6, as shown in FIG. 2(C). The Cr layer 6 and the Au layer 7 are continuously formed in a same sputtering system.

A second resist layer 8 is formed on the Au layer 7 in the bonding pad region, as shown in FIG. 2(D). The resist layer 8 is formed within the opened portion.

The Au layer 7 and the Cr layer 6 are etched under the same conditions as the first embodiment using the second resist layer 8 as a mask, as shown in FIG. 2(E).

The second resist layer 8 and the protective resist layer 25 are removed and a bonding pad is completed, as shown in FIG. 2(F).

According to the second preferred embodiment, when the Cr layer 6 and the Au layer 7 for the bonding pad are etched in a photo-lithography etching process using the second resist layer 8 as a mask, the protective resist layer 25 protects the interdigital electrode 10 from the etching process. Thus, there is no damage to the interdigital electrode 10.

As the protective resist layer 25 has an opened portion which is 20 μm wider than that of the first embodiment, bumps at the edge of the lower portion of the bonding pad become smaller, compared with the bonding pad of the first embodiment. Then, if a pad electrode is later formed on the bonding pad, a swell at the edge of the bonding pad can be restrained (referring to FIG. 1(F) and FIG. 2(F)). It is therefore possible to a precisely form the bonding pad and to provide a better SAW device.

A manufacturing method according to the third embodiment will be shown hereinafter referring to FIG. 3(A)–FIG. 3(F). Elements of this embodiment which are similar to those of the first embodiment are marked with the same reference symbols of the first embodiment. Before the step of FIG. 3(A), a step which corresponds to the step of FIG. 1(A) is carried out.

In this embodiment, after forming an oxide layer 4 on the substrate 1 and the interdigital electrode 10, the substrate 1 is dipped for two minutes into hot water which has a temperature within 80° C.–95° C., as shown in FIG. 3(A).

An alumina layer is formed on portions of the interdigital electrode 10 which contact the hot water. If pinholes exist in the oxide layer 4, alumina layers will be formed on portions which correspond to the pinholes as a result of the hot water leaking through the pinholes.

"Following this process, the substrate 1 is cooled to room temperature, thereby avoiding breakage of the substrate 1 which can occur due to rapid cooling."

A first resist layer 5 having a predetermined pattern, is formed on the oxide layer 4. A portion of the oxide layer 4 is then opened using the resist layer 5 as a mask, as shown in FIG. 3(B).

"Then, a CR layer 6 and a Au layer 7 are formed on the first resist layer 5 and the substrate 1 using sputtering techniques, as shown in FIG. 3(C)."

A second resist layer 8 is formed on the Au layer 7 in the bonding pad region, as shown in FIG. 3(D). The Au layer 7 and the Cr layer 6 are etched under the same conditions as the first embodiment using the second resist layer 8 as a mask, as shown in FIG. 3(E).

"Then, the second resist layer 8 and the first resist layer 5 are removed and a bonding pad is completed, as shown in FIG. 3(F)."

In this embodiment, the alumina layers are formed on the portions of the interdigital electrode 10 which correspond with the pinhole in the oxide layer. The alumina is strongly resistant to an etching liquid. Therefore, if the etching liquid leaks to the interdigital electrode 10 through the pinholes in the oxide layer 4 during formation of the bonding pad, the interdigital electrode 10 can be protected by the alumina layers. Naturally, the oxide layer 4 protects the interdigital electrode 10 except for the portions on which the alumina layers are formed.

According to the third embodiment, as a strong resistant layer to a etching liquid is formed on the portion of the interdigital layer, an etching process for forming the bonding pad can be precisely carried out, while protecting the interdigital electrode. It is therefore possible to precisely form the bonding pad and to provide an improved SAW device.

The alumina layers can be formed using an oxide plasma treatment instead of the hot water treatment described above. In this case, after forming an oxide layer 4 on the substrate 1 and the interdigital electrode 10, the substrate 1 is treated in the atmosphere of a oxide plasma under the conditions of 1000 mTorr and 500 W for fifteen minutes, as shown in FIG. 4(A). After that, the same processes describe above are carried out, as shown in FIG. 4(B)–FIG. 4(F).

As a result of the oxide plasma treatment, the alumina layers are formed on the portions of the interdigital electrode 10 which correspond with the pinholes in the oxide layer.

According to the this embodiment, in addition to the effects of the third embodiment, it is easy to control the temperature of the processing steps, as compared with the third embodiment. Therefore, heat induced damage to the substrate can be reduced.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A method for manufacturing a surface acoustic wave device, comprising:

providing a piezoelectric substrate which includes an electrode region and a pad region;

forming an interdigital electrode in the electrode region on the piezoelectric substrate;

forming an insulating layer on the interdigital electrode and the piezoelectric substrate;

forming a first resist layer on the insulating layer in the electrode region;

etching the insulating layer using the first resist layer as a mask in order to expose a surface of the piezoelectric substrate in the pad region;

forming a pad electrode layer which extends from the surface of the piezoelectric substrate in the pad region onto the first resist layer;

forming a second resist layer on the pad electrode layer in the pad region; and etching the pad electrode layer using the second resist layer as a mask.

2. The method for manufacturing a surface acoustic wave device according to claim 1, wherein the pad electrode layer is comprised of two layers, and wherein the two layers are continuously formed in the same apparatus.

3. A method for manufacturing a surface acoustic wave device, comprising:

providing a piezoelectric substrate which includes an electrode region and a pad region;

forming an interdigital electrode in the electrode region on the piezoelectric substrate;

forming an insulating layer on the interdigital electrode and the piezoelectric substrate;

forming a first resist layer on the insulating layer in the electrode region;

etching the insulating layer using the first resist layer as a mask to expose a surface of the piezoelectric substrate in the pad region;

removing the first resist layer;

forming a protective resist layer on the insulating layer in the electrode region;

forming a pad electrode layer which extends from the surface of the piezoelectric substrate in the pad region onto the protective resist layer;

forming a second resist layer on the pad electrode layer in the pad region; and etching the pad electrode layer using the second resist layer as a mask.

4. The method for manufacturing a surface acoustic wave device according to claim 3, wherein the pad electrode layer is comprised of two layers, and wherein the two layers are continuously formed in the same apparatus.

5. The method for manufacturing a surface acoustic wave device according to claim 3, wherein the protective resist layer is formed as to expose a part of the insulating layer which is in a vicinity of the pad region.

6. A method for manufacturing a surface acoustic wave device, comprising;

providing a piezoelectric substrate which includes an electrode region and a pad region;

forming an interdigital electrode in the electrode region on the piezoelectric substrate;

forming an insulating layer on the interdigital electrode and the piezoelectric substrate;

forming an alumina layer on a surface of the interdigital electrode;

forming a first resist layer on the insulating layer in the electrode region;

etching the insulating layer using the first resist layer as a mask to expose a surface of the piezoelectric substrate in the pad region;

forming a pad electrode layer which extends from the surface of the piezoelectric substrate in the pad region onto the interdigital electrode and the first resist layer;

forming a second resist layer on the pad electrode layer in the pad region; and etching the pad electrode layer using the second resist layer as a mask.

7. The method for manufacturing a surface acoustic wave device according to claim 6, wherein the pad electrode layer is comprised of two layers, and wherein the two layers are continuously formed in the same apparatus.

8. The method for manufacturing a surface acoustic wave device according to claim 6, wherein the alumina layer is formed by dipping the piezoelectric substrate into water having a temperature of 80° C. or more.

9. The method for manufacturing a surface acoustic wave device according to claim 8, wherein the piezoelectric substrate is cooled at room temperature after the dipping of the piezoelectric substrate into water.

10. The method for manufacturing a surface acoustic wave device according to claim 6, wherein the alumina layer is formed by applying an oxygen plasma to the piezoelectric substrate.

* * * * *